(12) United States Patent
Han et al.

(10) Patent No.: US 8,354,009 B2
(45) Date of Patent: Jan. 15, 2013

(54) APPARATUS AND METHOD FOR MANUFACTURING STRESS-FREE FLEXIBLE PRINTED CIRCUIT BOARD

(75) Inventors: Jeon Geon Han, Seoul (KR); Kab Seog Kim, Gyeonggi-do (KR); Yong Mo Kim, Seoul (KR)

(73) Assignee: Sungkyunkwan University Foundation for Corporate Collaboration, Gyeonggi-do (KR)

( * ) Notice: Subject to any disclaimer, the term of this patent is extended or adjusted under 35 U.S.C. 154(b) by 1350 days.

(21) Appl. No.: 12/034,707

(22) Filed: Feb. 21, 2008

(65) Prior Publication Data

US 2008/0202919 A1    Aug. 28, 2008

(30) Foreign Application Priority Data

Feb. 22, 2007   (KR) ........................ 10-2007-0017716

(51) Int. Cl.
*C23C 14/00*    (2006.01)
(52) U.S. Cl. ............................. 204/192.14; 204/192.12
(58) Field of Classification Search ............. 204/192.12, 204/192.15, 298.26, 192.14
See application file for complete search history.

(56) References Cited

U.S. PATENT DOCUMENTS

| 4,407,712 | A | * | 10/1983 | Henshaw et al. | ........ | 204/298.05 |
|---|---|---|---|---|---|---|
| 5,135,630 | A | * | 8/1992 | Goldburt et al. | ......... | 204/192.14 |
| 5,154,810 | A | * | 10/1992 | Kamerling et al. | ...... | 204/192.13 |
| 5,166,774 | A | * | 11/1992 | Banerji et al. | ................ | 361/749 |
| 5,745,331 | A | * | 4/1998 | Shamouilian et al. | ........ | 361/234 |
| 5,968,328 | A | * | 10/1999 | Teschner et al. | ......... | 204/298.25 |
| 6,946,238 | B2 | * | 9/2005 | Zhang et al. | .................. | 430/321 |
| 7,422,792 | B2 | * | 9/2008 | Aida | ............................. | 428/458 |
| 2003/0068862 | A1 | * | 4/2003 | Li et al. | ......................... | 438/257 |
| 2003/0106644 | A1 | * | 6/2003 | Sirkis et al. | ............. | 156/345.48 |
| 2003/0201165 | A1 | * | 10/2003 | Anzaki et al. | ............ | 204/192.29 |
| 2005/0230242 | A1 | * | 10/2005 | Leonhardt et al. | ....... | 204/192.11 |
| 2006/0292383 | A1 | * | 12/2006 | Kohayashi et al. | ........... | 428/457 |

FOREIGN PATENT DOCUMENTS

JP          05326445 A   * 12/1993

OTHER PUBLICATIONS

Translation to Hirano (JP 05-326445) published Dec. 1993.*

* cited by examiner

*Primary Examiner* — Keith Hendricks
*Assistant Examiner* — John Brayton
(74) *Attorney, Agent, or Firm* — Quarles & Brady LLP

(57) ABSTRACT

An apparatus and method for manufacturing a highly efficient flexible thin metal film-laminated strip by improves adhesiveness between a polyimide strip and a thin metal film, and removes stress from thin films laminated through magnetron sputtering, which is a dry deposition process. The stress-free flexible circuit board manufacturing method includes the steps of: a) depositing a seed layer on the substrate using the magnetron deposition source; b) depositing a compressive thin film using the single magnetron deposition source arranged next to the magnetron deposition source; c) depositing tensile thin film using the dual magnetron deposition source arranged next to the single magnetron deposition source; and d) repeating the steps b) and c) so as to sequentially and alternately deposit compressive thin films and tensile thin films thereby obtaining a thick film with a desired thickness.

3 Claims, 6 Drawing Sheets

APPARATUS AND METHOD FOR MANUFACTURING STRESS-FREE FLEXIBLE PRINTED CIRCUIT BOARD

CROSS REFERENCES TO RELATED APPLICATIONS

This application claims the priority benefit of Korean patent application No. 10-2007-0017716 filed on Feb. 22, 2007, and is fully incorporated herein by reference.

STATEMENT REGARDING FEDERALLY SPONSORED RESEARCH

Not Applicable.

FIELD OF INVENTION

The present invention relates to an apparatus and method for manufacturing a flexible printed circuit board, and more particularly to an apparatus and method for manufacturing a highly efficient flexible thin metal film-laminated strip by improving adhesiveness between a substrate (e.g., polyimide strip) and a thin metal film, and removing stress from thin metal films formed through magnetron sputtering, which is a dry deposition process.

BACKGROUND OF INVENTION

Such a thin metal film-laminated strip may be fabricated by heating and pressing a rolled or electrolytic metal film (e.g., copper film), or the like on an adhesive-coated surface of a plastic strip (e.g., polyimide strip), thereby adhering the metal film to the plastic strip. Alternatively, such a thin metal film-laminated strip may be fabricated by applying a resin solution to a surface of a thin metal film (e.g. copper film), wherein the resin solution is prepared by solving a thermosetting resin with a proper organic solvent and then curing the thermosetting resin by heat simultaneously with vaporizing the solvent. With these methods, it is impossible to cope with high density wiring required in the semiconductor industrial due to difficulty in finely processing such a metal film in a width of not more than 10 μm because the thermal performance of the adhesive is inferior to that of the substrate (e.g., polymer strip), and the resultant metal film formed by the methods has a thickness of not less than 10 μm, which is too thick to be finely processed. In addition, the above-mentioned methods reveal vulnerability in terms of dimensional stability and flexibility of a final product. Recently, in order to overcome these problems, a metal for forming a conductor circuit (hereinafter, to be referred to as "circuit forming metal") is directly deposited on a plastic strip through sputtering, or a metal layer different from the circuit forming metal is deposited on the plastic strip through sputtering prior to depositing the circuit forming metal, so that the metal layer is interposed between the circuit forming metal and the plastic strip.

When forming a thin film by sputtering, a target formed from a thin film forming material is located within a vacuum chamber, a substrate is located at a position corresponding to the target, and then argon is introduced into the vacuum chamber. The target is negatively charged, and plasma is formed within the vacuum chamber, thereby ionizing argon. In addition, argon ions hit the surface of the negatively charged target. As such, particles are scattered from the target by the energy applied by the argon ions hitting against the target, and are then deposited on the substrate.

Sputtering processes employed for forming a thin metal film include diode sputtering, bias sputtering, RF sputtering, triode sputtering, and magnetron sputtering. The magnetron sputtering, which is most frequently used among the above-mentioned sputtering methods, has an advantage in that because a magnet is mounted on the rear side of a target, plasma is formed more densely at the area corresponding to the magnet as compared to the other area, thereby rendering more atoms scattered from the target, which increases the deposition rate.

Even if a thin metal (e.g., copper) film is deposited through magnetron sputtering, the metal film is stressed if it has a thickness of several or more microns. Therefore, when forming a thick metal film with a thickness of several or more microns, a thickness of not more than 1 μM of the film is firstly deposited through a dry deposition process employing magnetron sputtering, and then the remainder of the film is formed through wet electroplating.

Like this, when forming a laminated film with a thickness of several or more microns, wet electroplating is also carried out in combination with a dry deposition process because it is difficult to control stress only with a dry deposition process. If wet electroplating is also employed, a process for manufacturing a flexible metal (e.g., copper) film-laminated strip is complicated, and a manufacturing space should be increased. As a result, manufacturing costs and time are substantially increased. Furthermore, the electroplating has a problem of causing environmental pollution.

However, if thin metal (e.g., copper) films to be laminated are formed completely through a dry deposition process, a metal film-laminated strip is liable to be deformed due to the stress induced in the laminated film as the thickness of the metal film is increased. Thus, it cannot be assured to obtain a thickness of several or more microns for the copper film-laminated strip.

SUMMARY OF THE INVENTION

Accordingly, the present invention has been made to solve the above-mentioned problems occurring in the prior art and the present invention is to provide a method for manufacturing a flexible circuit board, which is adapted to fabricate a highly efficient flexible thin metal (e.g., copper) film-laminated strip by improving adhesiveness between a substrate (e.g., polyimide strip) and a metal thin film through magnetron sputtering, which is a dry deposition process, and by removing stress from laminated metal films formed through magnetron sputtering.

In other words, in order to solve the problems included in the prior art because the prior art should employ a wet electroplating process in combination with a dry deposition process due to stress induced in a thin metal film when manufacturing a flexible metal (e.g., copper) film-laminated strip, the present invention is to make it possible to laminate thin metal films with a predetermined thickness only through magnetron sputtering, which is a dry deposition process.

In order to achieve the above-mentioned object, there is provided a method of manufacturing a flexible circuit board using a plastic substrate (e.g., polyimide strip) with a magnetron sputtering apparatus, the method including the steps of: (a) forming a cross-linking layer on a surface of the substrate by making high-energy inert gas (e.g., argon) ions and metal ions sputtered from a target hit against and penetrate into a surface of the substrate with the magnetron sputtering apparatus; (b) forming a thin metal film by the metal ions and sputtered neutral metal particles, which hit against and penetrate into the cross-linking layer formed in step (a); (c)

depositing a thick metal film on the thin metal film formed in step (b) through magnetron sputtering.

In step (b), the thin metal film is formed by nucleation occurring on the basis of the metal ions which hit against and penetrate into the cross-linking layer formed in step (a).

In step (c), at least one thin metal film with tensile stress (hereinafter to be referred to as "tensile thin metal film") and at least one thin metal film with compressive stress (hereinafter to be referred to as "compressive thin metal film") are alternately laminated by a single magnetron deposition source and a dual magnetron deposition source, respectively, thereby forming a stress-free thick metal film.

The inventive method may further include a step of forming a moisture and oxygen barrier film on the surface of the polyimide strip opposite to the thick metal film from an oxide and a nitride after the thick copper film is formed in step (c) so as to prevent permeation of moisture and oxygen.

According to the present invention, a high molecular material or strip including polyimide, PET, liquid crystal polymer, PTFE, PC or acryl may be employed as the substrate.

BRIEF DESCRIPTION OF THE DRAWINGS

The above and other objects, features and advantages of the present invention will be more apparent from the following detailed description taken in conjunction with the accompanying drawings, in which.

DETAILED DESCRIPTION OF THE PREFERRED EMBODIMENTS

Figure 1:
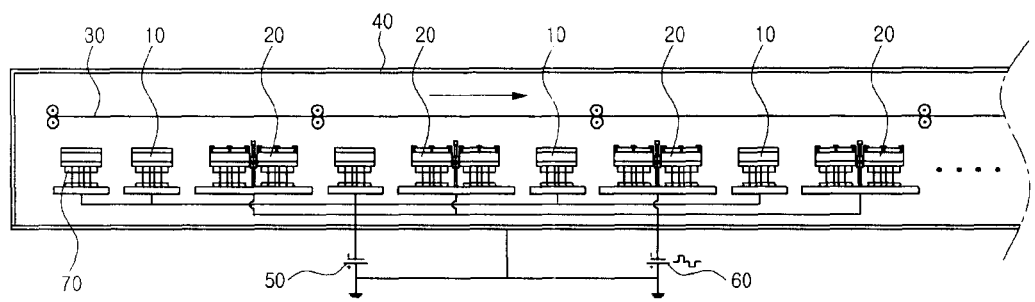
FIG. 1 shows an embodiment of a magnetron sputtering apparatus, to which a method of manufacturing a flexible circuit board according to the present invention is applied.

Hereinafter, a preferred embodiment of the present invention will be described with reference to the accompanying drawings. In the following description and drawings, the same reference numerals are used to designate the same or similar components.

Figure 4:
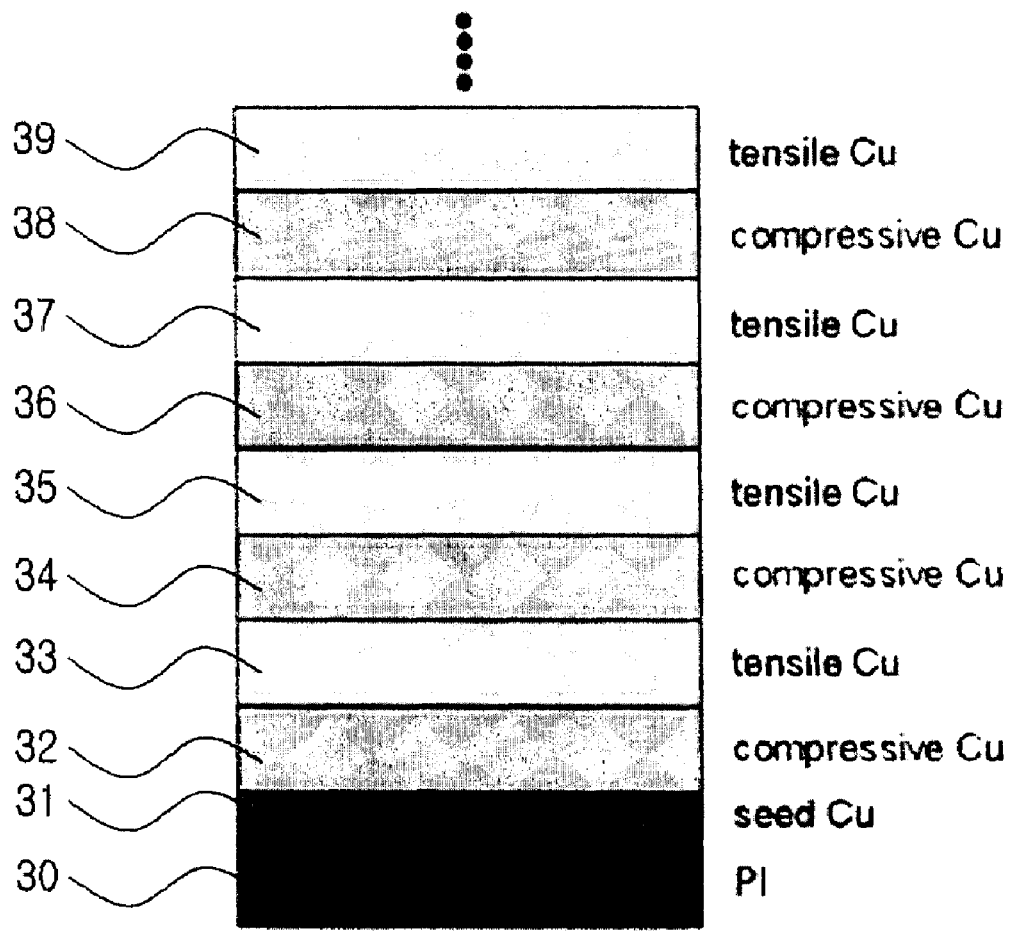
FIG. 4 shows a cross-section of a stress-free flexible copper film-laminated strip formed according to a method of manufacturing a flexible circuit board according to the present invention.

FIG. 1 shows an example of a magnetron sputtering apparatus, to which a method of manufacturing a flexible circuit board according to the present invention is applied, and FIG. 4 shows a cross-section of a stress-free flexible copper film-laminated strip deposited according to a method of manufacturing a flexible circuit board according to the present invention. The magnetron sputtering apparatus includes a plurality of single magnetron deposition sources 10, a plurality of dual magnetron deposition sources 20, and a substrate 30, the magnetron deposition sources 10 and 20, and the substrate 30 being installed within a vacuum chamber 40. Each of the single magnetron deposition sources 10 and the dual magnetron deposition sources 20 is equipped with a target. From the outside of the vacuum chamber 40, A DC (Direct Current) power supply 50 is connected to each of the single magnetron deposition sources 10 so as to supply DC power to each of the single magnetron deposition sources 10. In addition, a two-pole pulse DC power supply 60 is connected to each of the dual magnetron deposition sources 20 so as to supply two-pole pulse power to the dual magnetron deposition sources 20.

In the present embodiment, the single magnetron deposition sources 10 and the dual magnetron deposition sources 20 are arranged in a line, and the substrate 30 is located in front of the single magnetron deposition sources 10 and the dual magnetron deposition sources 20. As indicated by an arrow in FIG. 1, the substrate 30 is adapted to move according to a working sequence or working processes in front of the single magnetron deposition sources 10 and the dual magnetron deposition sources 20. Metal particles emitted from the magnetron deposition sources are deposited on the substrate 30 arranged in front of the magnetron deposition sources 10 and 20.

With reference to the advancing direction of the substrate 30, a magnetron deposition source 70 for depositing a metallic seed layer is firstly located, and a plurality of magnetron deposition source pairs, each of which consists of one single magnetron deposition source 10 and one dual magnetron deposition source 20, are arranged following the magnetron deposition source 70. The number of the magnetron deposition source pairs may be varied depending on the thickness of metallic layer to be deposited.

In order to emit metal particles from the targets of the magnetron deposition sources, negative or RF power is applied to the single magnetron deposition sources, and two-pole pulse DC power is applied to the dual magnetron deposition sources.

A method of manufacturing a stress-free flexible circuit board using the inventive flexible circuit board manufacturing apparatus constructed as described above will be described in detail with reference to the accompanying drawings.

At first, a polyimide strip is installed within the magnetron sputtering apparatus as a substrate 40, and a metal (e.g., copper) to be deposited on the polyimide strip by magnetron sputtering is installed as a target of each of the magnetron deposition sources, with a permanent magnet being installed in the rear side of the target.

Next, the inside of the vacuum chamber of the magnetron sputtering apparatus is evacuated by a vacuum pump, and then sputtering gas (e.g., argon gas) is introduced into the vacuum chamber.

The magnetron deposition source 70 for depositing a seed layer is connected to the negative pole of the DC power supply 50. In addition, the targets of the single magnetron deposition sources 10 are connected to the negative pole of the DC power supply 50 with the positive pole of the DC power supply 50 being connected to the vacuum chamber. Furthermore, the dual magnetron deposition sources 20 are connected to the negative pole of the two-pole pulse power supply 60 with the positive pole of the two-pole pulse power supply 60 being connected to the vacuum chamber. The vacuum chamber is grounded. Then, power is applied from the DC and two-pole pulse DC power supplies.

As the power is supplied from the DC and two-pole pulse DC power supplies, plasma is formed in front of the targets, and argon ions in the plasma hit against the targets, thereby causing sputtering. As such, sputtered metal particles hit against and penetrate into the surface of the substrate 30 (the polyimide strip) due to the difference in voltage between the targets and the substrate 30.

A cross-linking phenomenon is produced by light in the vacuum ultra violet region with a wavelength of not more than 200 nanometers, thereby forming a cross-linking layer on the polyimide strip, i.e., the substrate 30, wherein the light is produced in the plasma simultaneously when the ions and metal particles emitted from the target of the magnetron deposition source 70 hit against and penetrate into the surface of the polyimide strip. Among the deposition sources, the magnetron deposition source 70 is firstly positioned in the advancement direction of the substrate 30. Then, nucleation occurs on the basis of the metallic ions which hit against and penetrate into the cross-linking layer together with the ions, thereby forming a thin metallic (copper) film on the cross-linking layer. As shown in FIG. 4, the thin metallic film formed in this manner is the seed layer 31.

Then, through single magnetron sputtering using the first single magnetron deposition source 10, plasma is formed in front of the target of the first single magnetron deposition source 10, and argon ions in the plasma hit against the target, thereby causing sputtering. The sputtered metal particles hit against and penetrate into the surface of the substrate 30 (polyimide strip), thereby forming a compressive thin film 32 (see FIG. 4). Next, in the same manner, a tensile thin film 33 (see FIG. 4) is formed through two-pole pulse DC magnetron sputtering using the first dual magnetron deposition source 20.

Next, as shown in FIG. 1, the substrate 30 with the seed layer 31, the compressive thin film 32, and the tensile thin film 33 formed as described above moves in front of the continuous pairs of the single magnetron deposition sources 10 and dual magnetron deposition sources 20. On the substrate 30, a compressive copper film 34 and a tensile thin film 35 are formed through single magnetron sputtering using the second single magnetron deposition source 10, and through dual magnetron sputtering using the second dual magnetron deposition source 20, respectively. Like this, by forming compressive thin films 34, 36, 38, . . . and tensile thin films 35, 37, 39, . . . using the pairs of the single magnetron deposition sources 10 and dual magnetron deposition sources 20, it is possible to form a thick metal (copper) film with a thickness desired when forming a circuit.

In addition, after forming the thick metal film, a moisture and oxygen barrier film is formed from oxide and nitride on the rear side of the substrate (polyimide strip) so as to prevent the permeation of moisture and oxygen.

Figure 6:
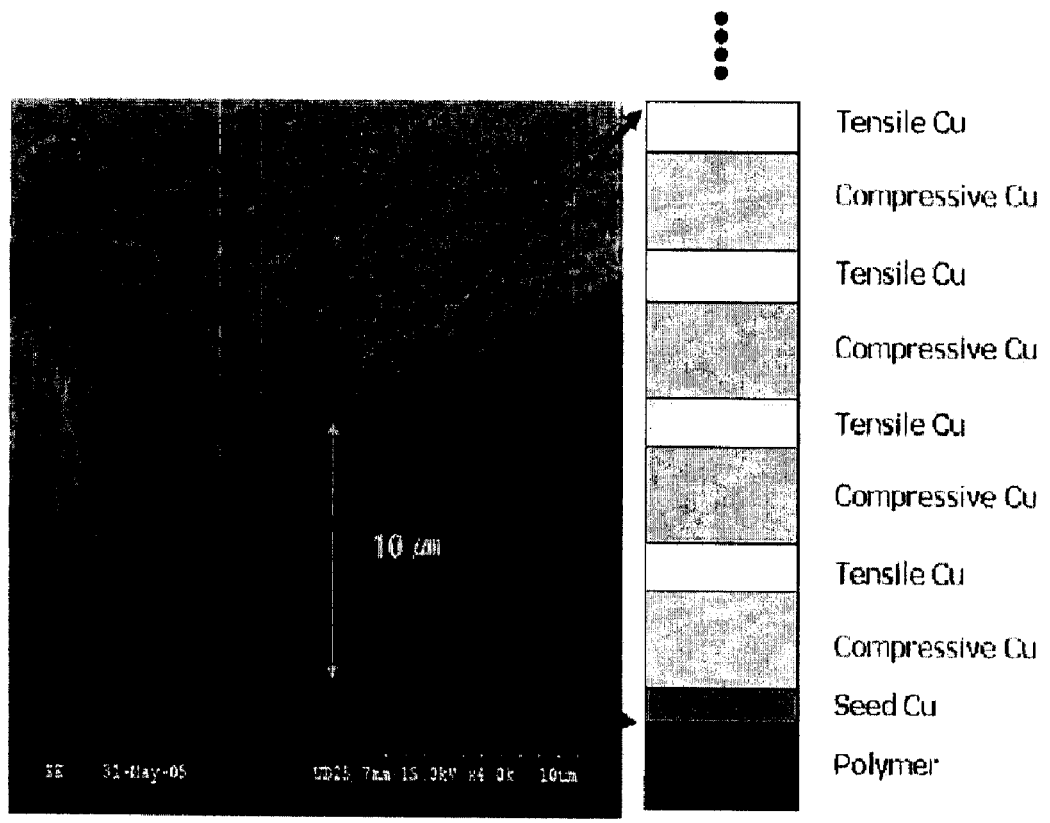
FIG. 6 shows a cross-section of the stress-free flexible copper film-laminated strip after etching.

Meanwhile, FIG. 6 shows a cross-section of a flexible copper film-laminated strip fabricated using the inventive flexible circuit board manufacturing apparatus as shown in FIG. 1. In the present embodiment, a polyimide strip is used as the substrate. Deposition conditions are as follows: the vacuum chamber is evacuated to $2 \times 10^{-5}$ torr, and then argon gas is introduced into the vacuum chamber, thereby maintaining the vacuum level of the vacuum chamber in $3 \times 10^{-3}$ torr; and a thick copper film is formed to a thickness of about 10 μm through above-mentioned single magnetron sputtering and two-pole pulse magnetron sputtering, thereby completing the flexible copper film-laminated strip.

Figure 2:
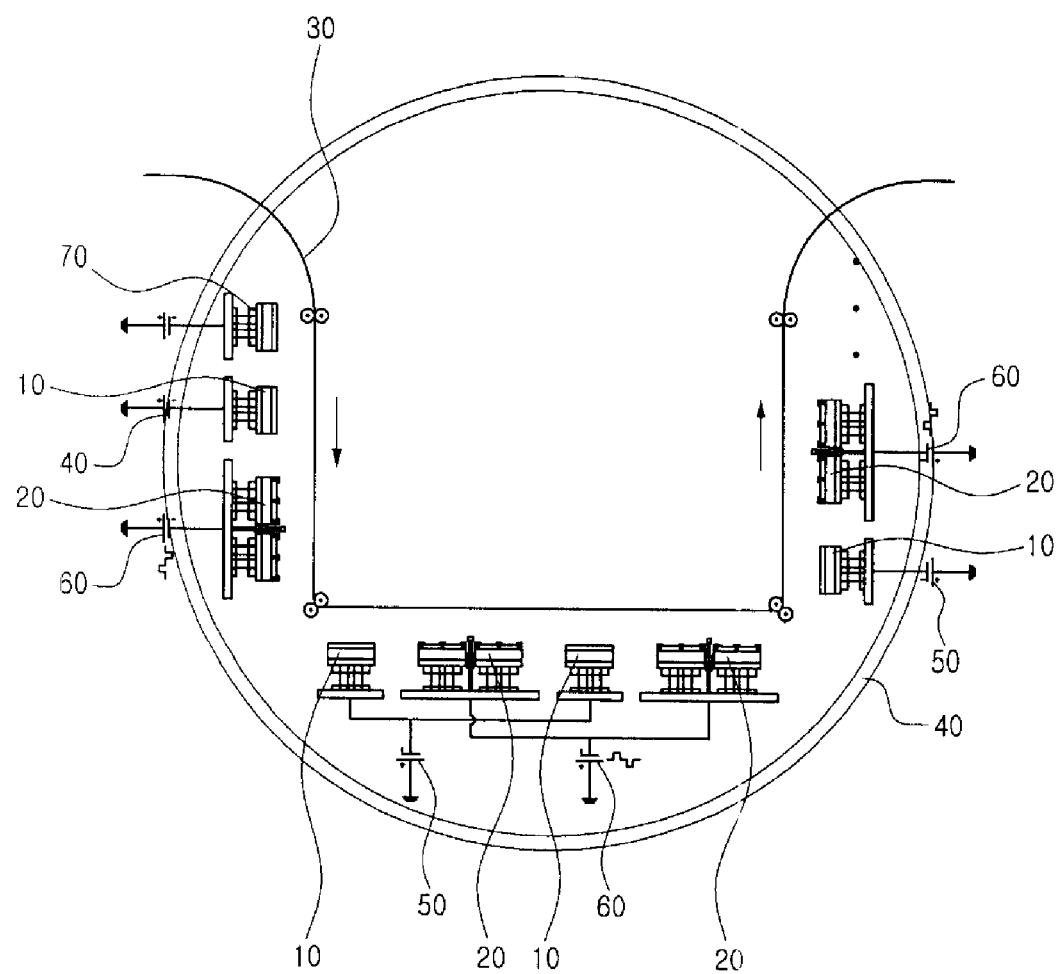
FIG. 2 shows another embodiment of a magnetron sputtering apparatus, to which a method of manufacturing a flexible circuit board according to the present invention is applied.

FIG. 2 shows another embodiment of a magnetron sputtering apparatus which is applied to the inventive method of manufacturing a flexible circuit board. The magnetron sputtering apparatus of FIG. 2 also forms a thick metal (copper) film with a thickness desired for forming a circuit, by forming a seed layer 31 on the substrate 30, and then alternately forming compressive thin film 32, 34, 36, 38, . . . and tensile thin films 33, 35, 37, 39, . . . on the seed layer 31. However, the embodiment of FIG. 2 arranges the magnetron sputtering apparatus in a web system type unlike the embodiment of FIG. 1 in consideration of spatial efficiency. Such a web system type renders a substrate to move along a "circular" or "U-shaped" path, wherein a plurality of single magnetron deposition sources 10 and a plurality of dual magnetron deposition sources 20 are arranged along the moving path of the substrate. The substrate is arranged in front of the single magnetron deposition sources 10 and the dual magnetron deposition sources 20, so that a proper thick film is deposited on the substrate from by the deposition sources. The flexible circuit board manufacturing apparatus of FIG. 2 constructed in the web system type arrangement as described above is advantageous in that it requires a relatively small space as compared to the flexible circuit board manufacturing apparatus of FIG. 1 arranging the magnetron deposition sources in a line, thereby enabling the miniaturization of the apparatus.

Figure 3:
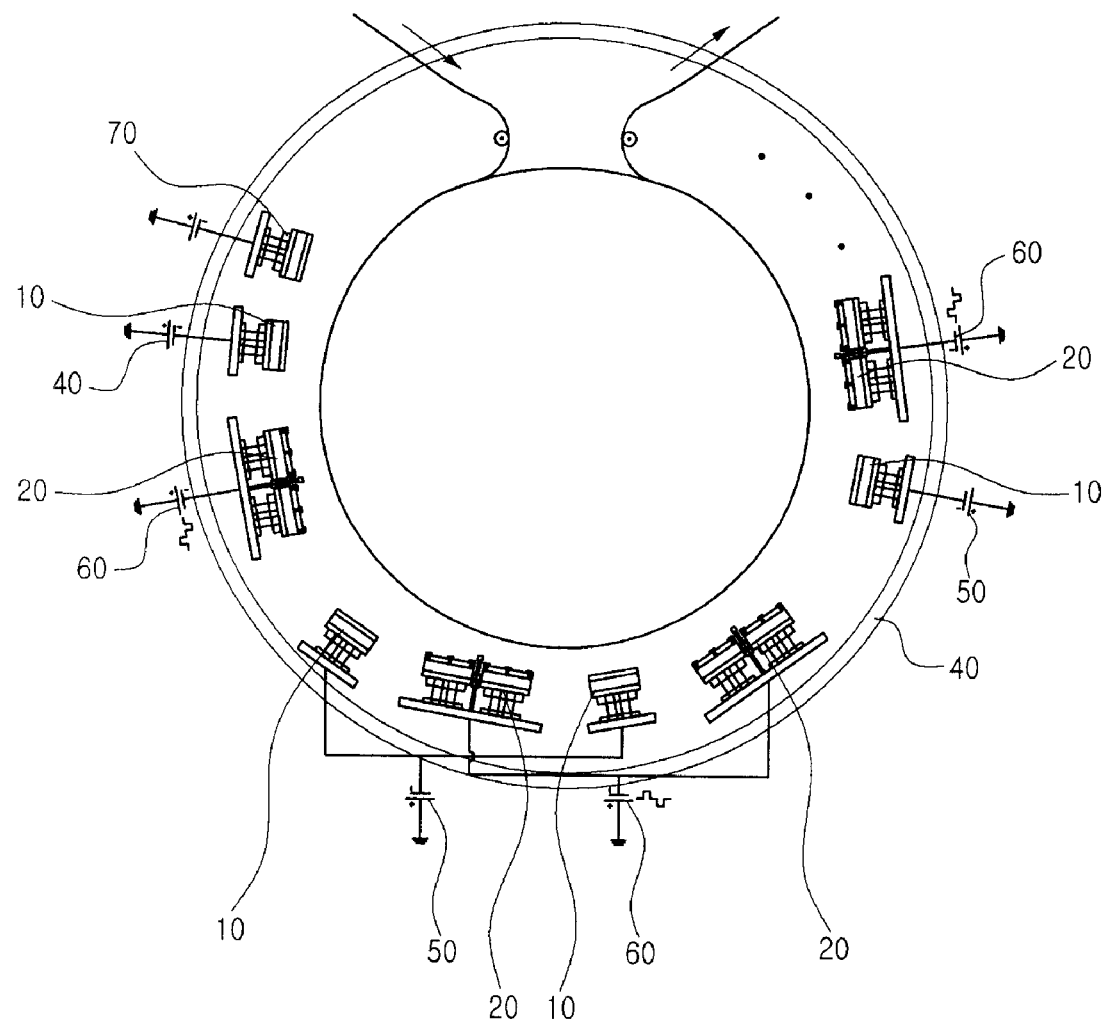
FIG. 3 shows another embodiment of a magnetron sputtering apparatus, to which a method of manufacturing a flexible circuit board according to the present invention is applied.

FIG. 3 shows another embodiment of a magnetron sputtering apparatus arranged in a web system type like FIG. 2. In the flexible circuit board manufacturing apparatus of FIG. 3, a drum is provided within the vacuum chamber 40, so that a substrate 30 passes around the drum exterior, and a plurality of magnetron sputtering sources are arranged around the drum. The web system type apparatus of FIG. 3 also requires a relatively small space, thereby enabling the miniaturization of the apparatus.

Although copper is used as target material in the above-mentioned embodiments, Al, Cr, ITO, $SiO^2$, SiN or the like may be also employed as the target material. In addition, Ar, He, Xe or Kr may be used as sputtering gas. The power applied to the single magnetron deposition sources is 250 to 500 V, and the power applied to the dual magnetron deposition sources is 300 to 600V.

Figure 5:
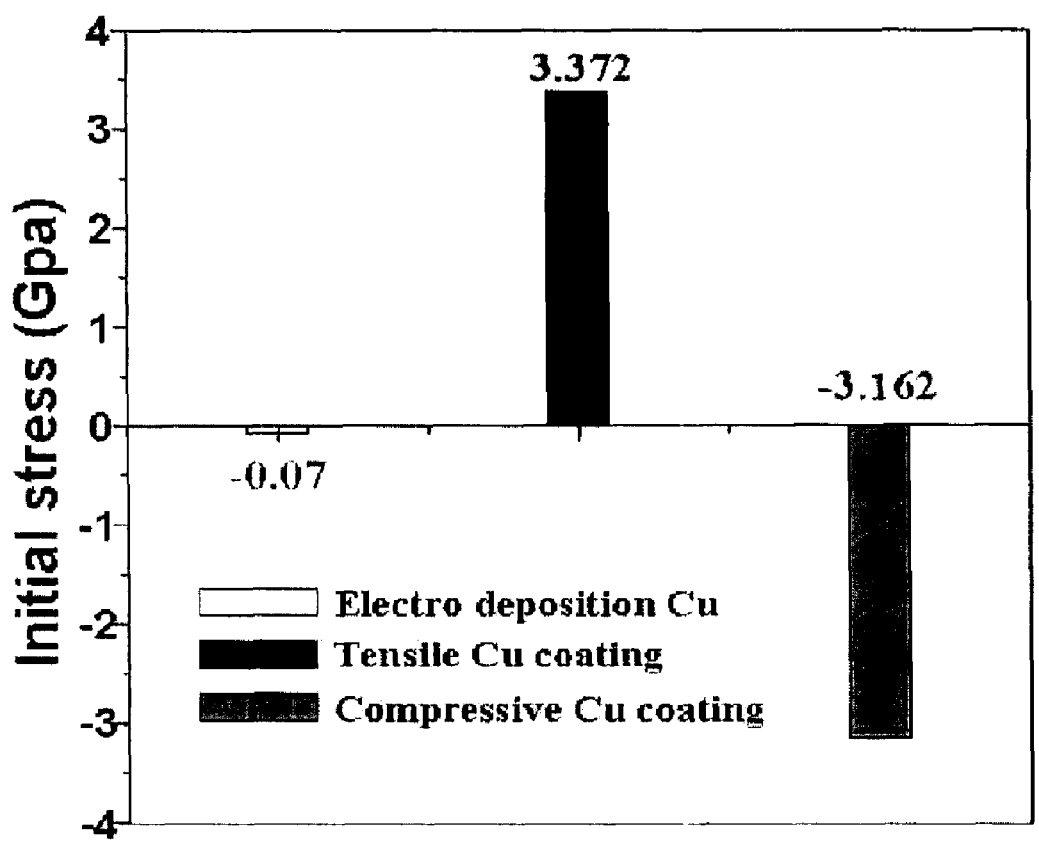
FIG. 5 shows stress in terms of respective deposition processes.

FIG. 5 is a graph showing stress values measured for a compressive thin film and a tensile thin film formed on a flexible circuit board according to the present invention. As shown in FIG. 5, the stress value for the compressive thin film deposited from a single magnetron deposition source 10 through single magnetron sputtering is about −3.162 GPa, and the stress value for the tensile thin film deposited from a dual magnetron deposition source 20 through dual magnetron sputtering is about 3.372 GPa. Therefore, the entire flexible circuit board according to the present invention, on which compressive thin films and tensile stress thin films are continuously and alternately formed, the compressive stress and the tensile stress compensate for each other, so that the entire laminated thin films will be free of stress. Therefore, according to the present invention, it is possible to improve adhesiveness between a polyimide strip and a thin metal film and to remove stress from a laminated film only through magnetron sputtering, which is a dry deposition process.

As described above, according to the inventive method of manufacturing a flexible circuit board, it is possible to manufacture a highly efficient flexible metal (e.g., copper) film-laminated strip, wherein adhesiveness between a substrate (e.g., polyimide strip) and a thin metal film is improved, and stress is removed from a laminated metal film only through magnetron sputtering, which is a dry deposition process.

Although the present invention has been described above in relation to specific embodiments for illustrative purposes, those skilled in the art will appreciate that various modifications, additions and substitutions are possible, without departing from the scope and spirit of the invention as disclosed in the accompanying claims.

We claim:

1. A method of manufacturing a flexible circuit board, the method comprising the steps of:
   (a) forming a cross-linking layer on a surface of a substrate by making high-energy Argon gas ions and sputtered metal ions hit against and penetrate into the surface of the substrate with a magnetron sputtering apparatus;

(b) forming a thin metal film by the metal ions which hit against and penetrate into the cross-linking layer formed in step (a), and sputtered neutral metal particles; and (c) forming a thick metal film on the thin metal film formed in step (b) while controlling stress through magnetron sputtering;

wherein the cross-linking layer is formed according to a cross-linking phenomenon occurring due to ultraviolet light in the vacuum, the light being produced simultaneously when the high-energy Argon gas ions hit against and penetrate into the surface of the substrate in the magnetron sputtering apparatus, the cross-linking layer improving adhesiveness between the substrate and the thin metal film;

wherein in step (b), the thin metal film is formed by nucleation wherein metal ions which hit against and penetrate into the cross-linking layer formed in step (a), and single magnetron sputtering employing DC power and dual magnetron sputtering employing two-pole pulse DC power are performed to deposit thin films forming the thick metal film while controlling the stress of the thin films, the two-pole pulse DC power including a negative pulse and a positive pulse.

2. The method as claimed in claim 1, further comprising the step of forming a moisture and oxygen barrier film from oxide and nitride on the surface of the substrate opposite to the thick metal film after the thick metal film is formed in step (c) so as to prevent permeation of moisture and oxygen.

3. The method as claimed in claim 1, wherein the substrate comprises a high molecular material or strip formed from polyimide, PET, liquid crystal polymer, PTFE, PC or acryl.

* * * * *